(12) United States Patent
Jeon et al.

(10) Patent No.: US 12,501,547 B2
(45) Date of Patent: Dec. 16, 2025

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Keesu Jeon, Suwon-si (KR); Kieun Cho, Suwon-si (KR); Myeonghui Jung, Suwon-si (KR); Minjae Seong, Suwon-si (KR); Sanghoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 206 days.

(21) Appl. No.: 18/541,770

(22) Filed: Dec. 15, 2023

(65) Prior Publication Data
US 2024/0276642 A1    Aug. 15, 2024

(30) Foreign Application Priority Data

Feb. 9, 2023    (KR) ........................ 10-2023-0017563

(51) Int. Cl.
| | |
|---|---|
| H05K 3/46 | (2006.01) |
| H05K 1/02 | (2006.01) |
| H05K 1/11 | (2006.01) |
| H05K 3/34 | (2006.01) |
| H05K 3/40 | (2006.01) |

(52) U.S. Cl.
CPC ............. *H05K 1/113* (2013.01); *H05K 3/341* (2013.01); *H05K 3/3452* (2013.01); *H05K 3/4007* (2013.01)

(58) Field of Classification Search
CPC .... H05K 3/4697; H05K 1/0298; H05K 1/185; H05K 3/4644; H05K 1/113
See application file for complete search history.

(56) References Cited

U.S. PATENT DOCUMENTS

| | | | |
|---|---|---|---|
| 2017/0064825 A1* | 3/2017 | Ishihara | ............... H05K 1/0298 |
| 2019/0215958 A1* | 7/2019 | Ishihara | ................. H05K 1/114 |

FOREIGN PATENT DOCUMENTS

| | | |
|---|---|---|
| KR | 10-2011-0131049 A | 12/2011 |
| KR | 10-2017-0056042 A | 5/2017 |
| KR | 10-2017-0059536 A | 5/2017 |
| WO | 2011/099820 A2 | 8/2011 |

* cited by examiner

*Primary Examiner* — Sherman Ng
(74) *Attorney, Agent, or Firm* — Morgan Lewis & Bockius LLP

(57) ABSTRACT

A circuit board according to an embodiment may include a first insulating layer, a first wiring layer that is buried in the first insulating layer, a first via layer that is disposed in the first insulating layer, and a second insulating layer that is disposed on the first insulating layer, and has a first surface which is in contact with the first insulating layer, and a second surface which is opposite to the first surface. In at least a part of the second insulating layer from the second surface of the second insulating layer, a cavity is positioned, and the second insulating layer includes a first part which is a part overlapping the cavity, and a second part which is a part thicker than the first part, and the first part of the second insulating layer includes first protruding parts and first concave parts.

20 Claims, 12 Drawing Sheets

United States Patent

CIRCUIT BOARD AND MANUFACTURING METHOD THEREOF

CROSS-REFERENCE TO RELATED APPLICATION

This application claims priority to and the benefit of Korean Patent Application No. 10-2023-0017563 filed in the Korean Intellectual Property Office on Feb. 9, 2023, the entire contents of which are incorporated herein by reference.

TECHNICAL FIELD

This disclosure relates to a circuit board and a manufacturing method thereof.

BACKGROUND

Circuit boards are boards having circuit patterns made of conductive materials such as copper on insulating materials, and as electronic devices in the IT field, including mobile phones, have been miniaturized, a method of forming cavities in a circuit board and placing electronic components such as ICs, active components, or passive components in the cavities has been proposed.

Depending on the depths of cavities formed in circuit boards such that electronic components can be placed in them, the heights of parts of electronic components which are placed in the circuit boards may also change.

As cavities in circuit boards get deeper, the heights of the parts of electronic components that can be placed inside the cavities get greater, and the overall thicknesses of products that are fabricated by packaging electronic components and circuit boards can decrease.

However, when cavities are formed in circuit boards, it is difficult to adjust the depths of the cavities, and cavities may be formed so deep that the surrounding circuit patterns are damaged.

The above information disclosed in this Background section is only for enhancement of understanding of the background of the invention, and therefore it may contain information that does not form the prior art that is already known in this country to a person of ordinary skill in the art.

SUMMARY

The present disclosure has been made in an effort to provide a circuit board capable of improving the reliability and rigidity of a whole package without requiring separate additional processes other than a cavity forming process, and a method of fabricating the same.

However, problems that embodiments are to solve are not limited to the above-described object, and can be variously expanded within the scope of technical spirits included in the embodiments.

An embodiment provides a circuit board includes: a circuit board including a first insulating layer, a first wiring layer that is buried in the first insulating layer, a first via layer that is disposed in the first insulating layer, and a second insulating layer that is disposed on the first insulating layer, and has a first surface which is in contact with the first insulating layer, and a second surface which is opposite to the first surface. In at least a part of the second insulating layer from the second surface of the second insulating layer, a cavity is positioned, and the second insulating layer includes a first part which is a part overlapping the cavity, and a second part which is a part thicker than the first part, and the first part of the second insulating layer includes first protruding parts and first concave parts.

The circuit board may further include a first pad layer including a part that is exposed from the first part of the second insulating layer, a second wiring layer that is buried in the second part of the second insulating layer, a second via layer that is disposed in the second part of the second insulating layer and is connected to the second wiring layer, a second pad layer that is disposed on the second surface of the second insulating layer and is connected to the second via layer, and a first solder resist layer that is disposed on the second insulating layer and exposes a part of the second pad layer.

The first protruding parts may have first high parts, and the first concave parts may have first low parts lower than the first high parts, and in a first protruding part and a first concave part adjacent to each other, each of the first high part of the first protruding part may be connected to the first low part of the first concave part may be connected to each other along concave lines.

The first protruding parts and the first concave parts may be disposed over an entire upper surface of the first part of the second insulating layer.

A difference in height between the first high parts of the first protruding parts and the first low parts of the first concave parts may be greater than 1 μm, and may be smaller than a thickness of the first pad layer.

In the side surface of the second part of the second insulating layer exposed inside the cavity, second protruding parts and second concave parts may be disposed.

Over the entire side surface of the second part of the second insulating layer, the second protruding parts and the second concave parts may be disposed.

The second protruding parts may have second high parts, the second concave parts may have second low parts lower than the second high parts, and each of the second high parts of the second protruding parts may be connected to the second low parts of second concave parts adjacent thereto, along concave lines.

A first distance that is a distance between the first high parts of the first protruding parts adjacent to each other and a second distance that is a distance between the second high parts of the second protruding parts adjacent to each other may satisfy the following relationship:

$$\frac{|(\text{Average of First Distances}) - (\text{Average of Second Distances})|}{\max(\text{Average of First Distances}, \text{Average of Second Distances})} \leq 0.1.$$

A thickness of the first part of the second insulating layer may be equal to or smaller than a thickness of the first pad layer.

The cavity may have a part whose width may gradually increase as it goes from a bottom to a top of the cavity in the thickness direction of the board.

A thickness of the first part of the second insulating layer may be 20 μm or smaller.

The circuit board may further include a third insulating layer that is disposed under the first insulating layer, a third wiring layer that is disposed under the first insulating layer and is buried in the third insulating layer, a third pad layer that is disposed under the third insulating layer, a third via layer that is disposed in the third insulating layer and connects the third wiring layer and the third pad layer, and a second solder resist layer that is disposed under the third insulating layer and exposes a part of the third pad layer.

A manufacturing method of a circuit board according to an embodiment includes: forming a plurality of first insulating layers with a wiring layer interposed therebetween such that the wiring layer is buried, forming a plurality of via layers that are positioned in the first insulating layers and are connected to at least some parts of the wiring layer, forming a first conductive layer on the first insulating layer so as to be connected to at least some parts of the plurality of via layers, stacking a second insulating layer to cover the first conductive layer, and forming a cavity in a part of the second insulating layer. The forming the cavity uses a $CO_2$ laser.

The forming the plurality of first insulating layers with the wiring layer interposed therebetween such that the wiring layer is buried may include forming a first plating layer on a carrier board, stacking the first insulating layer on the first plating layer, forming the wiring layer on the first insulating layer, stacking another first insulating layer to cover the wiring layer, and forming a second plating layer on the another first insulating layer.

The manufacturing method of the circuit board may further include forming a second via layer in the second insulating layer so as to be connected to a part of the first conductive layer, forming a second pad layer on the second insulating layer so as to be connected to the second via layer, and forming a solder resist layer on the second insulating layer such that a part of the second pad layer and a part of the second insulating layer are exposed, to be performed after the second insulating layer is stacked, wherein the cavity is formed in the part of the second insulating layer exposed from the solder resist layer.

A depth of the cavity may be less than a thickness of the second insulating layer prior to forming the cavity.

A portion of the wiring layer may be exposed by the cavity.

An embodiment provides a circuit board includes: an insulating body; a wiring layer disposed in the insulating body; and a via layer disposed in the insulating body to connect to the wiring layer. The insulating body includes a cavity exposing a portion of the wiring layer, and a surface of the insulating body, provided as a bottom surface or a side surface of the cavity, includes protruding parts and concave parts alternately arranged.

The circuit board may further include a solder resist layer disposed on the insulating body, and including one opening exposing a part of a pad pattern disposed on the insulating body and another opening aligned with the cavity.

On the bottom surface of the cavity, the protruding parts may be lower than the portion of the wiring layer exposed by the cavity.

The protruding parts and concave parts may be alternately arranged on the bottom surface of the cavity.

The protruding parts and concave parts may be alternately arranged on the side surface of the cavity.

According to the embodiments, it is possible to provide a circuit board capable of improving the reliability and rigidity of a whole package without requiring separate additional processes other than a cavity forming process, and a method of fabricating the same.

However, the effects of the embodiments are not limited to the above-described effects, and it is apparent that they can be variously expanded without departing from the spirit and scope of the present disclosure.

DETAILED DESCRIPTION OF THE EMBODIMENTS

Figure 1:
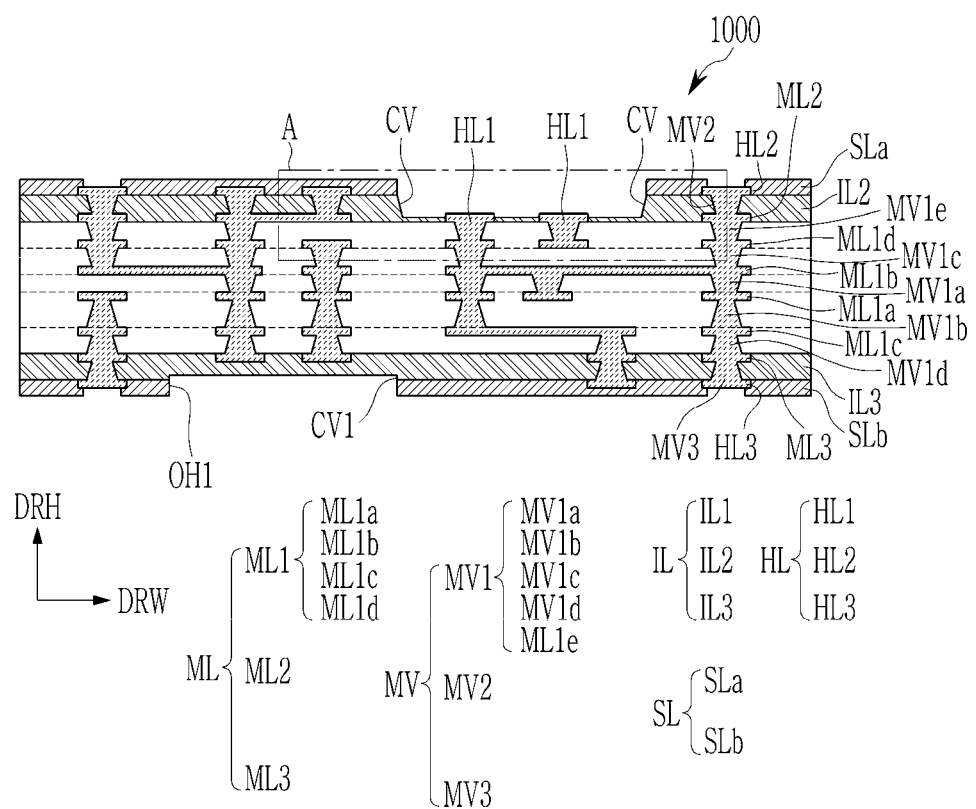
FIG. 1 is a cross-sectional view of a circuit board according to an embodiment.

In the following detailed description, only certain embodiments of the present disclosure have been shown and described, simply by way of illustration. The present disclosure can be variously implemented and is not limited to the following embodiments.

The drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto. In the drawings, the sizes and thicknesses of layers, films, panels, regions, etc., are exaggerated for clarity. In the drawings, for understanding and ease of description, the thicknesses of some layers and areas are exaggerated.

The accompanying drawings are provided for helping to easily understand embodiments disclosed in the present specification, and the technical spirit disclosed in the present specification is not limited by the accompanying drawings, and it will be appreciated that the present disclosure includes all of the modifications, equivalent matters, and substitutes included in the spirit and the technical scope of the present disclosure.

Terms including an ordinary number, such as first and second, are used for describing various constituent elements, but the constituent elements are not limited by the terms. The terms are used only to discriminate one constituent element from another constituent element.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is "on" a reference portion, the element is located above or below the reference portion, and it does not necessarily mean that the element is located "above" or "on" in a direction opposite to gravity.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance. Therefore, unless explicitly described to the contrary, the word "comprise", and variations such as "comprises" or "comprising", will be understood to imply the inclusion of stated elements but not the exclusion of any other elements.

Further, in the entire specification, when it is referred to as "on a plane", it means when a target part is viewed from above, and when it is referred to as "on a cross-section", it means when the cross-section obtained by cutting a target part vertically is viewed from the side.

Further, throughout the specification, when it is referred to as "connected", this does not only mean that two or more constituent elements are directly connected, but may mean that two or more constituent elements are indirectly connected through another constituent element, are physically connected, electrically connected, or are integrated even though two or more constituent elements are referred as different names depending on a location and a function.

In the entire specification, a board may have a structure that is wide on a plane and is thin on a cross-section, and the planar direction of a board may mean a direction parallel with a wide and flat surface of the board, and the thickness direction of a board may mean a direction perpendicular to a wide and flat surface of the board.

Hereinafter, a variety of embodiments and modifications will be described in detail with reference to the drawings.

Figure 2:
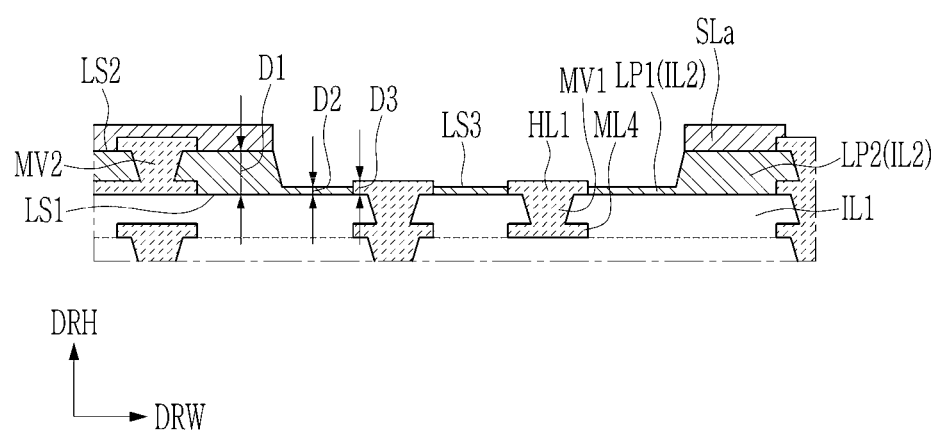
FIG. 2 is an enlarged cross-sectional view of part A of FIG. 1.

FIG. 1 is a cross-sectional view illustrating a circuit board according to an embodiment, and FIG. 2 is an enlarged cross-sectional view of part A of FIG. 1. In the following description, a planar direction DRW means a direction parallel with the surface of a first insulating layer IL1, and a height direction DRH means a direction perpendicular to the surface of the first insulating layer IL1.

Referring to FIG. 1 and FIG. 2, a circuit board 1000 according to the present embodiment may include a plurality of insulating layers IL, a plurality of wiring layers ML buried in the plurality of insulating layers IL, and a plurality of via layers MV, a plurality of pad layers HL, a plurality of solder resist layers SL, and a cavity CV located in the plurality of insulating layers IL.

The insulating layers IL, as an insulating body, may include a first insulating layer IL1, a second insulating layer IL2 located on the first insulating layer IL1, and a third insulating layer IL3 positioned under the first insulating layer IL1.

The plurality of wiring layers ML (ML1, ML2, and ML3) may include a first wiring layer ML1 buried in the first insulating layer IL1, a second wiring layer ML2 positioned in the second insulating layer IL2, and a third wiring layer ML3 positioned in the third insulating layer IL3. The plurality of wiring layers ML may contain a conductive material such as copper (Cu), aluminum (Al), silver (Ag), tin (Sn), gold (Au), nickel (Ni), lead (Pb), titanium (Ti), or an alloy thereof.

The plurality of via layers MV (MV1, MV2, and MV3) may include a first via layer MV1 positioned in the first insulating layer IL1, a second via layer MV2 positioned in the second insulating layer IL2, and a third via layer MV3 located in the third insulating layer IL3. The plurality of via layers MV may contain a conductive material such as copper (Cu), aluminum (Al), silver (Ag), tin (Sn), gold (Au), nickel (Ni), lead (Pb), titanium (Ti), or an alloy thereof.

The plurality of pad layers HL (HL1, HL2, and HL3) may include a first pad layer HL1 located on the second insulating layer IL2, a second pad layer HL2 positioned in the second insulating layer IL2, and a third pad layer HL3 positioned under the third insulating layer IL3. The plurality of pad layers HL may be connected to external wires so as to be able to exchange electrical signals of circuit boards with external electronic components (not shown in the drawings). The plurality of pad layers HL may contain a conductive material such as copper (Cu), gold (Au), or silver (Ag).

The first insulating layer IL1 may be formed of a thermosetting resin such as an epoxy resin, a thermoplastic resin such as polyimide, or a reinforcement, such as glass fiber or an inorganic filler, impregnated with a resin, for example, prepreg, and may also contain a thermosetting resin and/or a photo-curable resin, and so on; however, it is not limited thereto. The first insulating layer IL1 may contain glass fiber. The first insulating layer IL1 may be a laminate made of a plurality of insulating layers in the fabricating process.

The first wiring layer ML1 may be buried in the first insulating layer IL1. The first wiring layer ML1 may be a wiring layer having a multi-layer structure. In the embodiment, the first wiring layer ML1 composed of four layers ML1a, ML1b, ML1c, and ML1d is shown in the drawings; however, the first wiring layer ML1 is not limited thereto, and may be composed of various numbers of layers.

The first via layer MV1 is positioned in the first insulating layer IL1 so as to be connected to the first wiring layer ML1. The first via layer MV1 may be formed in a multi-layer structure. The outermost layer of the first via layer MV1 may be connected to the second wiring layer ML2 and the third wiring layer ML3. It may also be connected to the first pad layer HL1. In the embodiment, the first via layer MV1 composed of five layers is shown in the drawings; however, the first via layer MV1 is not limited thereto, and may be composed of various numbers of layers.

The second insulating layer IL2 may be positioned on the first insulating layer IL1. The second insulating layer IL2 may have a first surface LS1 that is in contact with the first insulating layer IL1, and a second surface LS2 that is opposite to the first surface LS1.

As the material of the second insulating layer IL2, an insulating material may be used. The insulating material that is used as the material of the second insulating layer IL2 may contain an organic resin and an inorganic filler. However, the insulating material may not contain glass fiber. As an example, the organic resin may contain at least one of epoxy, polyimide, and so on. Also, as an example, the inorganic filler may be at least one selected from a group consisting of eucryptite ($LiAlSiO_4$), isotropic zirconium vanadate ($ZrV_2O_7$), and isotropic zirconium tungstate ($ZrW_2O_8$), but is not limited thereto. The insulating material that is used as the material of the second insulating layer IL2 may be thermoset and/or photo-curable, but is not limited thereto.

The cavity CV may be positioned in a part of the second insulating layer IL2. Specifically, the cavity CV may extend downward from the second surface LS2 of the second insulating layer IL2. Also, the cavity CV may be formed so as not to pass through the second insulating layer IL2.

The second insulating layer IL2 may include a first part LP1 and a second part LP2. The first part LP1 may overlap the cavity CV. In other words, the first part LP1 may be positioned under the cavity CV. The second part LP2 may be located on the side of the first part LP1 and the cavity CV. The second part LP2 may be a part thicker than the first part LP1 is. Therefore, the thickness D2 of the first part LP1 may be smaller than the thickness D1 of the second part LP2. The thickness D2 of the first part LP1 may be 20 μm or smaller.

The following third surface LS3 means the upper surface of the first part LP1 of the second insulating layer IL2 overlapping the cavity CV. In other words, the third surface LS3 may be the surface of the first part LP1 opposite to the first surface LS1.

The cavity CV may have a structure in which the upper part is wider than the lower part. In other words, a part of the cavity CV that is on a level with the second surface LS2 of the second insulating layer IL2 may be wider than a part of the cavity overlapping a third surface LS3. The cavity CV may have a part whose width gradually increases as it goes from the bottom to the top in the thickness direction (DRH) of the board. In the embodiment, the cavity CV that gradually gets wider as it goes from the bottom to the top is shown in the drawings; however, the shape of the cavity is not limited thereto, and the side wall of the second part LP2 of the second insulating layer IL2 may have a protruding part. Accordingly, the cavity CV may have a part in which the upper part is narrower than the lower part.

The first pad layer HL1 may be positioned on the first insulating layer IL1. The first pad layer HL1 may be buried in the first part LP1 of the second insulating layer IL2 such that some parts are exposed. As an example, the surface of the first pad layer HL1 may be exposed from the first part LP1 of the second insulating layer IL2. Also, a part of the side surface of the first pad layer HL1 may be exposed. Therefore, the thickness D2 of the first part LP1 is equal to or smaller than the thickness D3 of the first pad layer HL1.

The second pad layer HL2 may be positioned on the second part LP2 of the second insulating layer IL2. In other words, the second pad layer HL2 may be positioned on the second surface LS2 of the second insulating layer IL2.

The second wiring layer ML2 may be positioned on the first insulating layer IL1. The second wiring layer ML2 may be buried in the second part LP2 of the second insulating layer IL2.

The second via layer MV2 may be located in the second insulating layer IL2. The second via layer MV2 may pass through the second part LP2 of the second insulating layer IL2 so as to connect the second wiring layer ML2 and the second pad layer HL2.

The third insulating layer IL3 may be positioned under the first insulating layer IL1. The third insulating layer IL3 may be formed of a thermosetting resin such as an epoxy resin, a thermoplastic resin such as polyimide, or a reinforcement, such as glass fiber or an inorganic filler, impregnated with a resin, for example, prepreg, and may also contain a thermosetting resin and/or a photo-curable resin, and so on; however, it is not limited thereto. The third insulating layer IL3 may contain glass fiber.

As another example, the third insulating layer IL3 may contain an organic resin and an inorganic filler as materials. Also, an insulating material which is a material for the third insulating layer IL3 may not contain glass fiber. As an example, the organic resin may contain at least one of epoxy, polyimide, and so on. Also, as an example, the inorganic filler may be at least one selected from a group consisting of eucryptite ($LiAlSiO_4$), isotropic zirconium vanadate ($ZrV_2O_7$), and isotropic zirconium tungstate ($ZrW_2O_8$), but is not limited thereto. The insulating material that is used as the material of the third insulating layer IL3 may be thermoset and/or photo-curable, but is not limited thereto. In a part of the third insulating layer IL3, a first cavity CV1 may be formed.

The third wiring layer ML3 may be positioned under the first insulating layer IL1. The third wiring layer ML3 may be buried in the third insulating layer IL3.

The third pad layer HL3 may be positioned under the third insulating layer IL3.

The third via layer MV3 may be positioned in the third insulating layer IL3. The third via layer MV3 may pass through the third insulating layer IL3 so as to connect the third wiring layer ML3 and the third pad layer HL3.

The solder resist layers SL may include a first solder resist layer SLa that is positioned on the second insulating layer IL2 and exposes a part of the second pad layer HL2, and a second solder resist layer SLb that is positioned under the third insulating layer IL3 and exposes a part of the third pad layer HL3.

Figure 3:
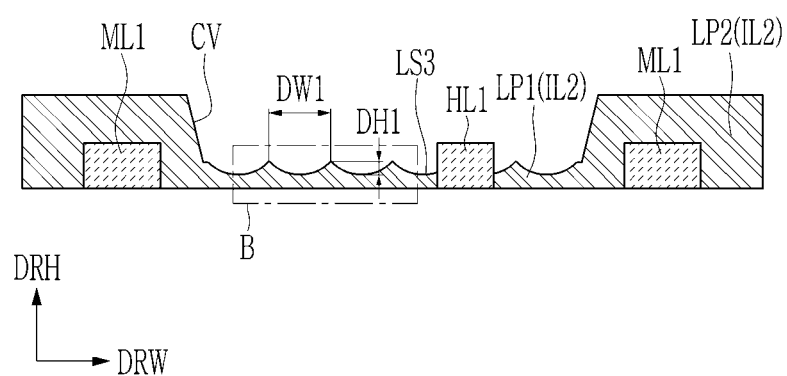
FIG. 3 is a cross-sectional view illustrating a part of a second insulating layer.
Figure 5:
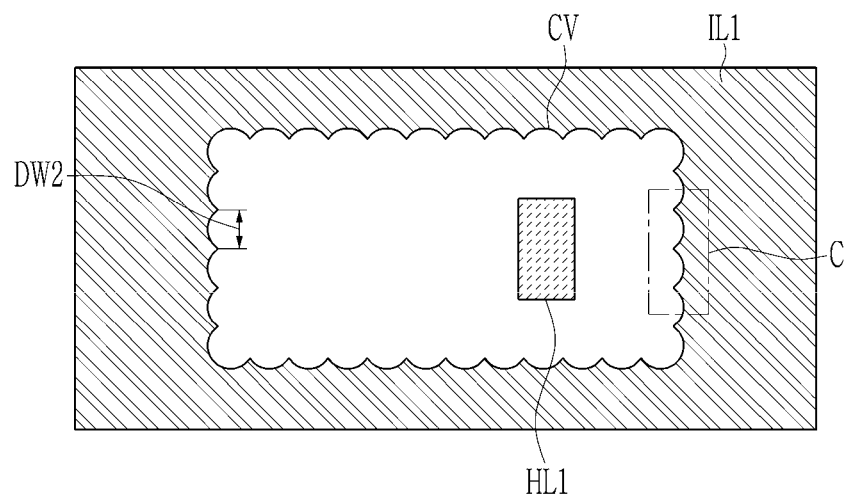
FIG. 5 is a plan view of a part shown in FIG. 3.
Figure 6:
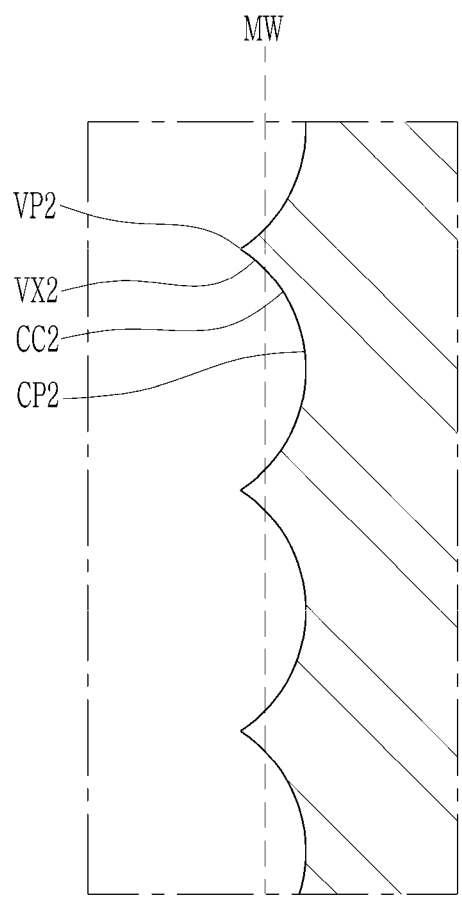
FIG. 6 is an enlarged plan view of part C of FIG. 5.

Hereinafter, the second insulating layer IL2 in which the cavity CV is positioned will be described in detail with reference to FIG. 3 to FIG. 6. FIG. 3 is a cross-sectional view illustrating a part of the second insulating layer IL2, FIG. 4 is an enlarged cross-sectional view of part B of FIG. 3, FIG. 5 is a plan view of a part shown in FIG. 3, and FIG. 6 is an enlarged plan view of part C of FIG. 5.

Figure 4:
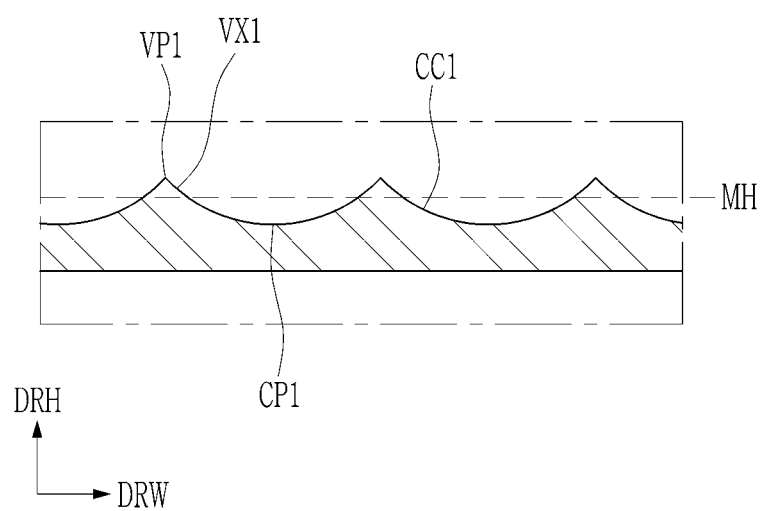
FIG. 4 is an enlarged cross-sectional view of part B of FIG. 3.

Referring to FIG. 3 and FIG. 4, the first part LP1 of the second insulating layer IL2 may include a first protruding part VX1 and a first concave part CC1. The numbers of protruding parts VX1 and first concave parts CC1 that are formed in the first part LP1 of the second insulating layer IL2 may be two or greater. The first protruding parts VX1 may be higher than the average height MH of the third surface LS3. The first concave parts CC1 may be lower than the average height MH of the third surface LS3.

The first protruding parts VX1 may have first high parts VP1, and the first concave parts CC1 may have first low parts CP1. The first high parts VP1 may be parts higher than their peripheries. The first low parts CP1 may be parts lower than their peripheries. Each first high part VP1 is connected to each first low part CP1 adjacent thereto, along a concave curve. In other words, the first protruding parts VX1 and the first concave parts CC1 may be alternately connected in a wavy shape.

The plurality of first protruding parts VX1 and the plurality of first concave parts CC1 may be positioned over the entire third surface LS3 of the first part LP1 of the second insulating layer IL2. In other words, the first protruding parts VX1 and the first concave parts CC1 may be formed in a repetitive pattern over the entire third surface LS3.

The difference in height (DH1) between the first high parts VP1 of the first protruding parts VX1 and the first low parts CP1 of the first concave parts CC1 may be greater than 1 μm, and be smaller than the thickness of the first pad layer HL1. The first protruding parts VX1 are lower than the portion of the first pad layer HL1.

Referring to FIG. 5 and FIG. 6, in the side surface of the second part LP2 of the second insulating layer IL2, a second protruding part VX2 and a second concave part CC2 may be formed. The numbers of second protruding parts VX2 and second concave parts CC2 that are formed in the side surface of the second part LP2 of the second insulating layer IL2 may be two or more. At the same height of the circuit board 1000, the second protruding parts VX2 may protrude from the average line MW of the side surface of the second part LP2 toward the inside of the cavity CV. The second concave parts CC2 may be recessed from the average line MW of the side surface of the second part LP2 toward the opposite side of the average line to the cavity CV.

The second protruding parts VX2 may have second high parts VP2, and the second concave parts CC2 may have second low parts CP2. The second high parts VP2 may protrude further toward the inside of the cavity CV than their peripheries do. The second low parts CP2 may be recessed further toward the opposite side to the cavity CV than their peripheries do.

Each second high part VP2 may be connected to each second low part CP2 adjacent thereto, along a concave curve. In other words, the second protruding parts VX2 and the second concave parts CC2 may be connected to each other in a wavy shape.

The plurality of second protruding parts VX2 and the plurality of second concave parts CC2 may be positioned over the entire side surface of the second part LP2 of the second insulating layer IL2. In other words, the second protruding parts VX2 and the second concave parts CC2 may be formed in a repetitive pattern of wave shapes over the entire side surface of the second part LP2.

The difference between the size of the wave shapes formed in the third surface LS3 of the first part LP1 of the second insulating layer IL2 and the size of the wave shapes formed in the side surface of the second part LP2 may be small. In other words, the difference between a first distance DW1 which is the distance between the first high parts VP1 of first protruding parts VX1 adjacent to each other and a second distance DW2 which is the distance PT between the second high parts VP2 of second protruding parts VX2 adjacent to each other may be small. Specifically, the difference between the average of the first distances DW1 and the average of the second distances DW2 may be 10% or less of the larger one of the average of the first distances DW1 and the average of the second distances DW2. In other words, the following relationship may be established.

$$\frac{|(\text{Average of First Distances}) - (\text{Average of Second Distances})|}{\max(\text{Average of First Distances}, \text{Average of Second Distances})} \leq 0.1$$

Hereinafter, a manufacturing method of a circuit board according to an embodiment will be described with reference to FIG. 7 to FIG. 12 together with FIG. 1 to FIG. 6. FIG. 7 to FIG. 12 are cross-sectional views illustrating the manufacturing method of a circuit board according to the embodiment.

Figure 7:
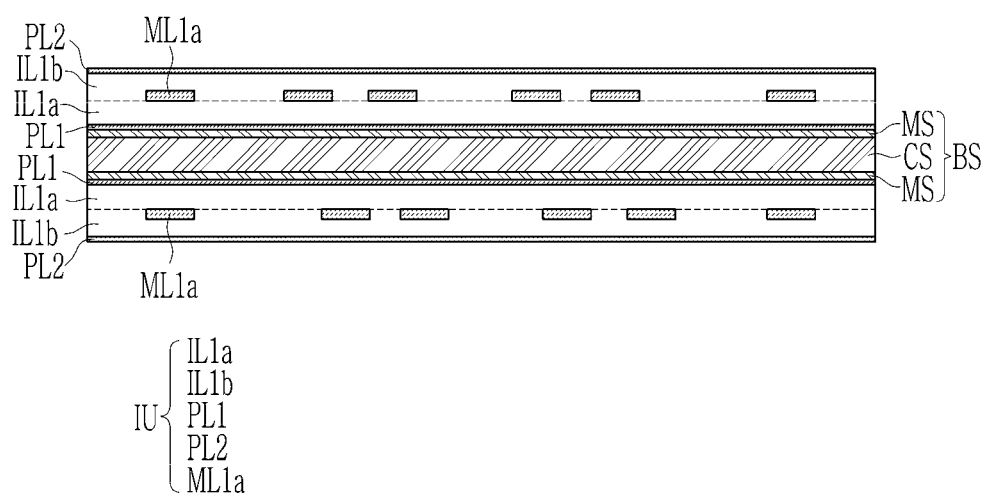
FIG. 7 to FIG. 12 are cross-sectional views illustrating a method of fabricating a circuit board according to an embodiment.

Referring to FIG. 7, on each of both sides of a carrier board BS, a plurality of first insulating layers IL1a and IL1b (IL1) may be formed with a first wiring layer ML1a (ML1) interposed therebetween. The carrier board BS may include a core part CS, and thin metal films MS stacked on both sides of the core part CS. As an example, on each thin metal film MS of the carrier board BS, a first plating layer PL1 may be formed, and on the first plating layer PL1, a first insulating layer IL1a may be stacked, and on the stacked first insulating layer IL1a, a first wiring layer ML1a may be formed, and another first insulating layer IL1b may be stacked such that the first wiring layer ML1a is buried, and on the first insulating layer IL1b, a second plating layer PL2 may be formed.

Figure 8:
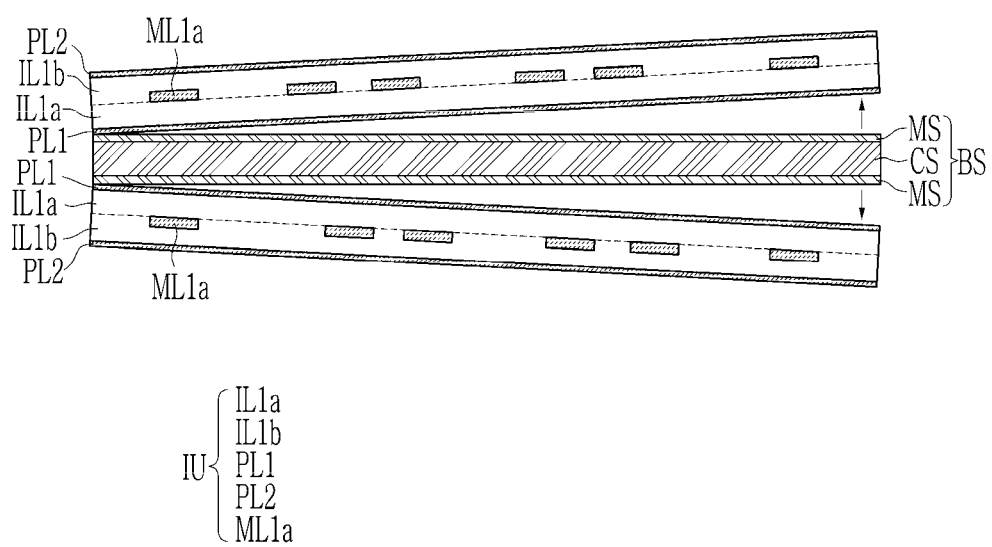

Next, as shown in FIG. 8, from each of both sides of the carrier board BS, the plurality of first insulating layers IL1a and IL1b (IL1) stacked with the first wiring layer ML1a (ML1) interposed therebetween may be peeled off. At this time, the first plating layer PL1 and the second plating layer PL2 may also be peeled off.

Hereinafter, one part of the two parts peeled off from both sides of the carrier board BS as described above will be described.

Figure 9:
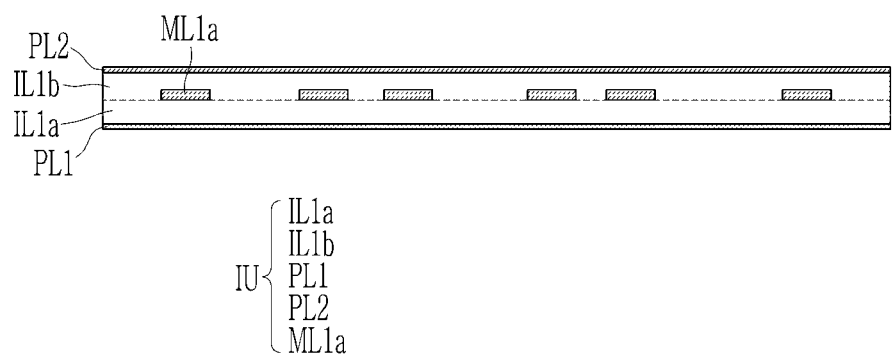
Figure 10:
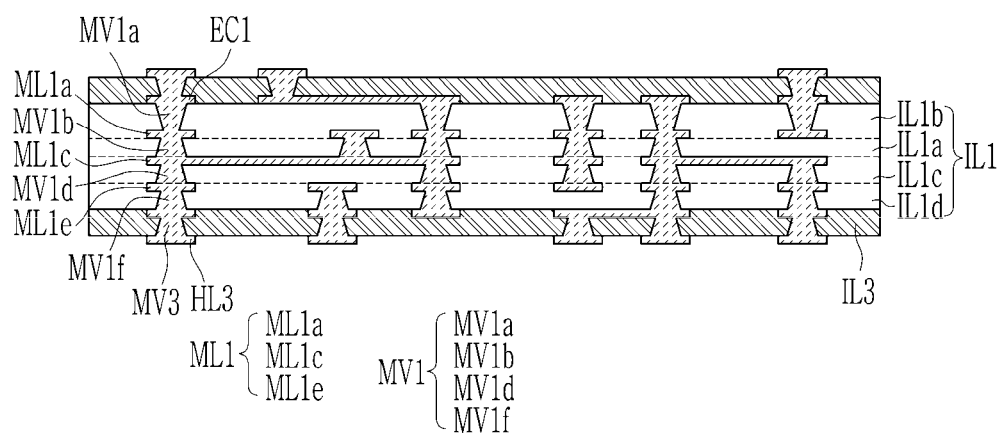

Referring to FIG. 9 and FIG. 10, on any one side or both sides of the first wiring layer ML1a, first via layers MV1a and MV1b (MV1) may be formed so as to be connected to at least a part of the first wiring layer ML1a.

On any one side or both sides of the plurality of first insulating layers IL1a and IL1b, a first wiring layer ML1c (ML1) may be further formed, and another first insulating layer IL1c may be formed such that the first wiring layer ML1c is buried, and a first via layer MV1d (MV1) may be formed so as to be connected to the first wiring layer ML1c. As shown in FIG. 10, on the first insulating layer IL1c already formed, another first wiring layer ML1e (MV1) may be formed, and another first insulating layer IL1d (IL1) may be formed such that the first wiring layer ML1e is buried, and a first via layer MV1f (MV1) may be further formed. This process may be repeated.

Subsequently, on the first insulating layer IL1, a first conductive layer EC1 may be formed, and a second insulating layer IL2 may be formed such that the first conductive layer EC1 is buried. The first conductive layer EC1 may form a first pad layer HL1 and a second wiring layer ML2. The second insulating layer IL2 may contain an organic resin and an inorganic filler. Also, the second insulating layer IL2 may be formed of a material which does not contain glass fiber.

In the second insulating layer IL2, a second via layer MV2 may be formed, and on the second insulating layer IL2, a second pad layer HL2 may be formed.

Also, on the lower surface of the first insulating layer IL1, a third wiring layer ML3 may be formed, and a third insulating layer IL3 may be formed such that the third wiring layer ML3 is buried. In the third insulating layer IL3, a third via layer MV3 may be formed, and on the lower surface of the third insulating layer IL3, a third pad layer HL3 may be formed.

Figure 11:
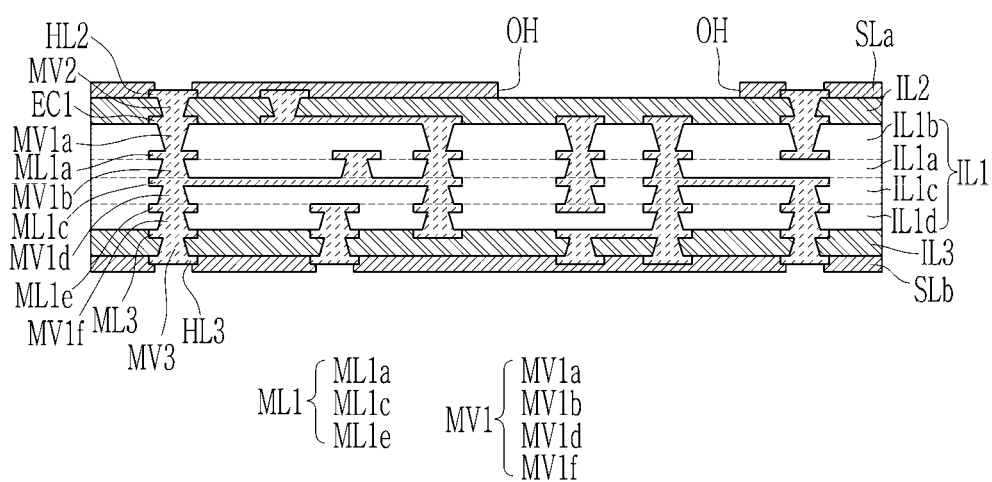

Referring to FIG. 11, on the second insulating layer IL2, a first solder resist layer SLa may be formed so as to expose a part of the second pad layer HL2. The first solder resist layer SLa may be etched to form an opening OH. From the opening OH, a part of the second insulating layer IL2 can be exposed.

Under the first insulating layer IL1, a third wiring layer ML3 may be formed, and a third insulating layer IL3 may be formed such that the third wiring layer ML3 is buried.

Under the third insulating layer IL3, a second solder resist layer SLb may be formed to expose some parts of the third pad layer HL3.

Figure 12:
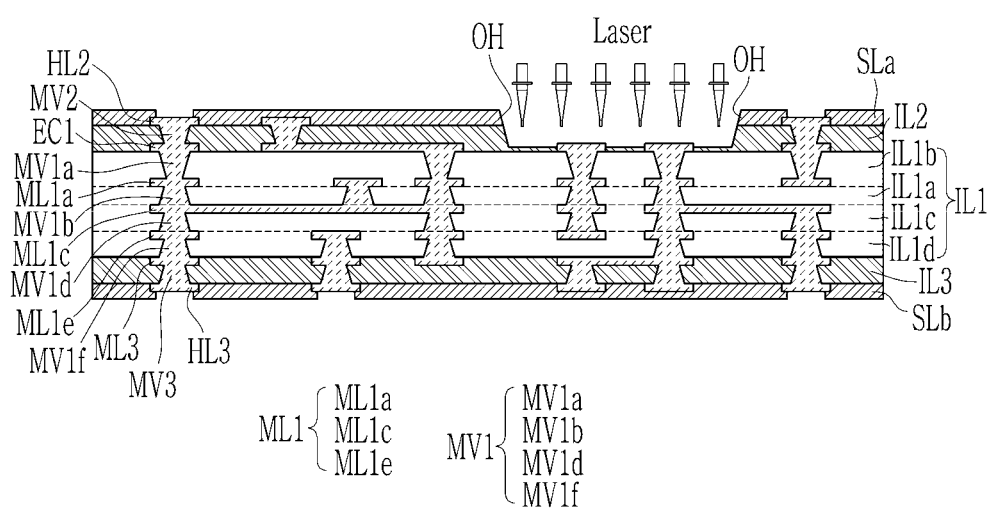

Referring to FIG. 12, in the second insulating layer IL2 exposed from the opening OH, a cavity CV may be formed. In order to form the cavity CV, a $CO_2$ laser may be used. When the cavity CV is formed, a repetitive pattern of wave shapes may be formed in the third surface LS3 of the second insulating layer IL2 and the side surface of the second part LP2, and some parts of the first conductive layer EC1 may be exposed from the third surface LS3 so as to become the first pad layer HL1. The first conductive layer EC1 buried in the second part LP2 may become the second wiring layer ML2. In other words, the second wiring layer ML2 exposed by the cavity forms the first pad layer HL1.

Referring to FIG. 1, the second solder resist layer SLb may be etched to form a first opening OH1. Subsequently, in the third insulating layer IL3 exposed from the first opening OH1, a first cavity CV1 may be formed.

According to the circuit board and the method of fabricating the same according to the present embodiments, since an electronic component can be placed in the cavity CV, it is possible to reduce the overall thickness of a package including the circuit board. Further, since the wave-shaped pattern is repeated in the surface of the cavity CV, the overall surface area increases. As a result, during molding after mounting an electronic component, adhesion can improve. Therefore, the reliability and rigidity of the whole package can improve. Furthermore, since any additional processes other than using a $CO_2$ laser are not required, it is possible to improve the economic efficiency. In addition, since the wave-shaped patterns are formed in the insulating material, defects which may occur when the patterns are separately formed can be prevented.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A circuit board comprising:
a first insulating layer;
a first wiring layer that is buried in the first insulating layer;
a first via layer that is disposed in the first insulating layer; and
a second insulating layer that is disposed on the first insulating layer, and has a first surface which is in contact with the first insulating layer, and a second surface which is opposite to the first surface,
wherein in at least a part of the second insulating layer from the second surface of the second insulating layer, a cavity is positioned, and
the second insulating layer includes a first part which is a part overlapping the cavity, and a second part which is a part thicker than the first part, and
the first part of the second insulating layer includes first protruding parts and first concave parts.

2. The circuit board of claim 1, further comprising:
a first pad layer including a part that is exposed from the first part of the second insulating layer;
a second wiring layer that is buried in the second part of the second insulating layer;
a second via layer that is disposed in the second part of the second insulating layer and is connected to the second wiring layer;
a second pad layer that is disposed on the second surface of the second insulating layer and is connected to the second via layer; and
a first solder resist layer that is disposed on the second insulating layer and exposes a part of the second pad layer.

3. The circuit board of claim 2, wherein
the first protruding parts have first high parts,
the first concave parts have first low parts lower than the first high parts, and
each of the first high parts of the first protruding parts is connected to the first low parts of first concave parts adjacent thereto, along concave lines.

4. The circuit board of claim 3, wherein
the first protruding parts and the first concave parts are disposed over an entire upper surface of the first part of the second insulating layer.

5. The circuit board of claim 3, wherein
a difference in height between the first high parts of the first protruding parts and the first low parts of the first concave parts is greater than 1 μm, and is smaller than a thickness of the first pad layer.

6. The circuit board of claim 4, wherein
in a side surface of the second part of the second insulating layer exposed to the cavity, second protruding parts and second concave parts are disposed.

7. The circuit board of claim 6, wherein
over the entire side surface of the second part of the second insulating layer, the second protruding parts and the second concave parts are disposed.

8. The circuit board of claim 6, wherein
the second protruding parts have second high parts,
the second concave parts have second low parts lower than the second high parts, and
each of the second high parts of the second protruding parts is connected to the second low parts of the second concave parts adjacent thereto, along concave lines.

9. The circuit board of claim 8, wherein
a first distance that is a distance between the first high parts of the first protruding parts adjacent to each other and a second distance that is a distance between the second high parts of the second protruding parts adjacent to each other satisfies the following relationship:

$$\frac{|(\text{Average of First Distances}) - (\text{Average of Second Distances})|}{\max(\text{Average of First Distances}, \text{Average of Second Distances})} \leq 0.1.$$

10. The circuit board of claim 2, wherein
a thickness of the first part of the second insulating layer is equal to or smaller than a thickness of the first pad layer.

11. The circuit board of claim 2, further comprising:
a third insulating layer that is disposed under the first insulating layer;
a third wiring layer that is disposed under the first insulating layer and is buried in the third insulating layer;
a third pad layer that is disposed under the third insulating layer;
a third via layer that is disposed in the third insulating layer and connects the third wiring layer and the third pad layer; and
a second solder resist layer that is disposed under the third insulating layer and exposes a part of the third pad layer.

12. The circuit board of claim 1, wherein
the cavity has a part whose width gradually increases as it goes from a bottom to a top of the cavity in the thickness direction of the board.

13. The circuit board of claim 1, wherein
a thickness of the first part of the second insulating layer is 20 μm or smaller.

14. A manufacturing method of a circuit board, comprising:
forming a plurality of first insulating layers with a wiring layer interposed therebetween such that the wiring layer is buried;
forming a plurality of first via layers that are positioned in the first insulating layers and are connected to at least some parts of the wiring layer;
forming a first conductive layer on the first insulating layer so as to be connected to at least some parts of the plurality of via layers;
stacking a second insulating layer to cover the first conductive layer; and
forming a cavity in a part of the second insulating layer, wherein the forming the cavity uses a $CO_2$ laser.

15. The manufacturing method of the circuit board according to claim 14, wherein
the forming the plurality of first insulating layers with the wiring layer interposed therebetween such that the wiring layer is buried includes:
forming a first plating layer on a carrier board,
stacking the first insulating layer on the first plating layer, forming the wiring layer on the first insulating layer,
stacking another first insulating layer to cover the wiring layer, and
forming a second plating layer on the another first insulating layer.

16. The manufacturing method of the circuit board according to claim 15, further comprising:
after the second insulating layer is formed,
forming a second via layer in the second insulating layer so as to be connected to a part of the first conductive layer;
forming a pad layer on the second insulating layer so as to be connected to the second via layer; and
forming a solder resist layer on the second insulating layer such that a part of the pad layer and a part of the second insulating layer are exposed,
wherein the cavity is formed in the part of the second insulating layer exposed from the solder resist layer.

17. The manufacturing method of the circuit board according to claim 14, wherein a depth of the cavity is less than a thickness of the second insulating layer prior to forming the cavity.

18. The manufacturing method of the circuit board according to claim 14, wherein a portion of the wiring layer is exposed by the cavity.

19. A circuit board comprising:
an insulating body;
a wiring layer disposed in the insulating body; and
a via layer disposed in the insulating body to connect to the wiring layer,
wherein the insulating body includes a cavity exposing a portion of the wiring layer, and
a surface of the insulating body, provided as a bottom surface or a side surface of the cavity, includes protruding parts and concave parts alternately arranged.

20. The circuit board of claim 19, wherein
on the bottom surface of the cavity, the protruding parts are lower than the portion of the wiring layer exposed by the cavity.

* * * * *